(12) United States Patent  
Deane

(10) Patent No.: US 7,627,204 B1  
(45) Date of Patent: Dec. 1, 2009

(54) OPTICAL-ELECTRICAL FLEX INTERCONNECT USING A FLEXIBLE WAVEGUIDE AND FLEXIBLE PRINTED CIRCUIT BOARD SUBSTRATE

(75) Inventor: Peter Deane, Moss Beach, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/934,585

(22) Filed: Nov. 2, 2007

(51) Int. Cl.  
*G02B 6/12* (2006.01)  
*G02B 6/10* (2006.01)

(52) U.S. Cl. .................. 385/14; 385/129; 385/130

(58) Field of Classification Search ............... None  
See application file for complete search history.

(56) References Cited

U.S. PATENT DOCUMENTS

| | | | | |
|---|---|---|---|---|
| 5,375,184 | A * | 12/1994 | Sullivan | 385/129 |
| 6,539,157 | B2 * | 3/2003 | Doi | 385/129 |
| 6,865,307 | B1 * | 3/2005 | Ma et al. | 385/14 |
| 7,197,221 | B2 * | 3/2007 | Ohtsu et al. | 385/130 |
| 7,267,930 | B2 | 9/2007 | Payne | |
| 7,333,682 | B2 * | 2/2008 | Kobayashi et al. | 385/14 |
| 2002/0181882 | A1 * | 12/2002 | Hibbs-Brenner et al. | 385/52 |
| 2004/0218848 | A1 * | 11/2004 | Shen et al. | 385/14 |
| 2005/0201681 | A1 | 9/2005 | Payne | |
| 2005/0201693 | A1 | 9/2005 | Korenaga et al. | |
| 2005/0220393 | A1 * | 10/2005 | Riester et al. | 385/15 |
| 2005/0271319 | A1 | 12/2005 | Graham | |
| 2005/0271326 | A1 | 12/2005 | Luo | |
| 2006/0001653 | A1 | 1/2006 | Smits | |
| 2006/0002655 | A1 | 1/2006 | Smits | |
| 2007/0032275 | A1 | 2/2007 | Suzuki et al. | |
| 2008/0031579 | A1 * | 2/2008 | Enami et al. | 385/102 |
| 2008/0118200 | A1 * | 5/2008 | Kim et al. | 385/14 |
| 2008/0226222 | A1 * | 9/2008 | Kim et al. | 385/14 |
| 2008/0285910 | A1 * | 11/2008 | Yamada et al. | 385/14 |
| 2009/0041408 | A1 * | 2/2009 | Kondo et al. | 385/14 |

OTHER PUBLICATIONS

U.S. Appl. No. 11/498,356, filed Aug. 2, 2006.  
Office Action dated Aug. 24, 2009 in U.S. Appl. No. 12/345,487.

* cited by examiner

*Primary Examiner*—Uyen-Chau N Le  
*Assistant Examiner*—Chris H Chu  
(74) *Attorney, Agent, or Firm*—Beyer Law Group LLP

(57) ABSTRACT

A flex interconnect with an integrated electrical-to optical and optical-to-electrical transport layer, which enables the optical transport of critical high speed data without the need of expensive and bulky optical connectors. The flex interconnect assembly includes a flexible printed circuit substrate, which includes one or more electrical interconnects, formed on the flexible printed circuit substrate, for transmitting one or more electrical signals respectively. The flexible printed circuit substrate also includes an optical waveguide mounted onto the substrate. The optical waveguide includes an integral optical transport layer, including electrical-to-optical and optical-to-electrical interfaces connected at either end of the optical waveguide. With the integrated optical transport layer, the flex interconnect can receive electrical signals, convert and transmit them to optical signals, and then convert them back to electrical signals, all without expensive and bulky opto-electrical connectors. In one embodiment, the flex interconnect is used for transmitting both electrical and optical signals in a portable device, such as a cell phone, PDA, personal computer, and the like.

24 Claims, 6 Drawing Sheets

OPTICAL-ELECTRICAL FLEX INTERCONNECT USING A FLEXIBLE WAVEGUIDE AND FLEXIBLE PRINTED CIRCUIT BOARD SUBSTRATE

BACKGROUND OF THE INVENTION

1. Field of the Invention

The present invention relates generally to flex interconnects, and more particularly, to a flex interconnect including a optical waveguide formed on a flexible printed circuit board substrate for transmitting and receiving both optical and electrical signals.

2. Description of the Related Art

The functionality provided on portable devices, such as laptop computers, cell phones, personal-digital assistants (PDAs), cameras, and MP3 players, is both converging and continually increasing. For example, not that long ago, a person typically had a separate laptop computer for performing data processing, sending emails and text messaging, a cell phone for making wireless phone calls, a camera for taking pictures, and an MP3 player for listening to music and other audio content. More recently, however, the functionality provided by one or more of these separate devices has been implemented all on one device. For example, cell phones now commonly have cameras, allow users to receive and transmit still video images, have emails and text message capabilities, include embedded MP3 players, and as well perform standard cell phone functionality. In addition, as bandwidth increases and wireless broadband services proliferate, the ability for these portable devices to both generate and receive streaming video will also become commonplace.

High data rate transmissions, such as that used during the transfer of streaming video, typically is performed using low amplitude electrical signals over wires. Low amplitude differential signals, however, are susceptible to data corruption when exposed to RF noise. This is particularly troublesome in wireless portable devices. If the portable device is streaming video while transmitting or receiving radio signals, the RF noise may corrupt the low amplitude signals, resulting in video errors.

The use of an optical link in a portable device for high band width applications, such as streaming video, is advantageous for several reasons. Optical signals are largely immune from RF noise. The data transfer rate is also typically greater using an optical link as compared to electrical wires.

Power and control signals, which are typically of high amplitude and low frequency, are not as susceptible to RF noise. The use of electrical wires for the transmission of these types of signals in a portable device is usually adequate.

Accordingly, a opto-electric flex interconnect with an integrated electrical-to-optical and optical-to-electrical interface, which enables the optical transport of critical high speed data without the need of expensive and bulky optical connectors, and electric traces for power and control signals, is therefore needed.

SUMMARY OF THE INVENTION

A flex interconnect with an integrated electrical-to optical and optical-to-electrical transport layer, which enables the optical transport of critical high speed data without the need of expensive and bulky optical connectors, is disclosed. The flex interconnect assembly includes a flexible printed circuit substrate, which includes one or more electrical interconnects, formed on the flexible printed circuit substrate, for transmitting one or more electrical signals respectively. The flexible printed circuit substrate also includes an optical waveguide mounted onto the substrate. The optical waveguide includes an integral optical transport layer, including electrical-to-optical and optical-to-electrical interfaces connected at either end of the optical waveguide. With the integrated optical transport layer, the flex interconnect can receive electrical signals, convert and transmit them to optical signals, and then convert them back to electrical signals, all without expensive and bulky opto-electrical connectors. In one embodiment, the flex interconnect is used for transmitting both electrical and optical signals in a portable device, such as a cell phone, PDA, personal computer, and the like.

BRIEF DESCRIPTION OF THE DRAWINGS

The invention, together with further advantages thereof, may best be understood by reference to the following description taken in conjunction with the accompanying drawings in which.

In the figures, like reference numbers refer to like components and elements.

DETAILED DESCRIPTION OF THE INVENTION

Figure 1:
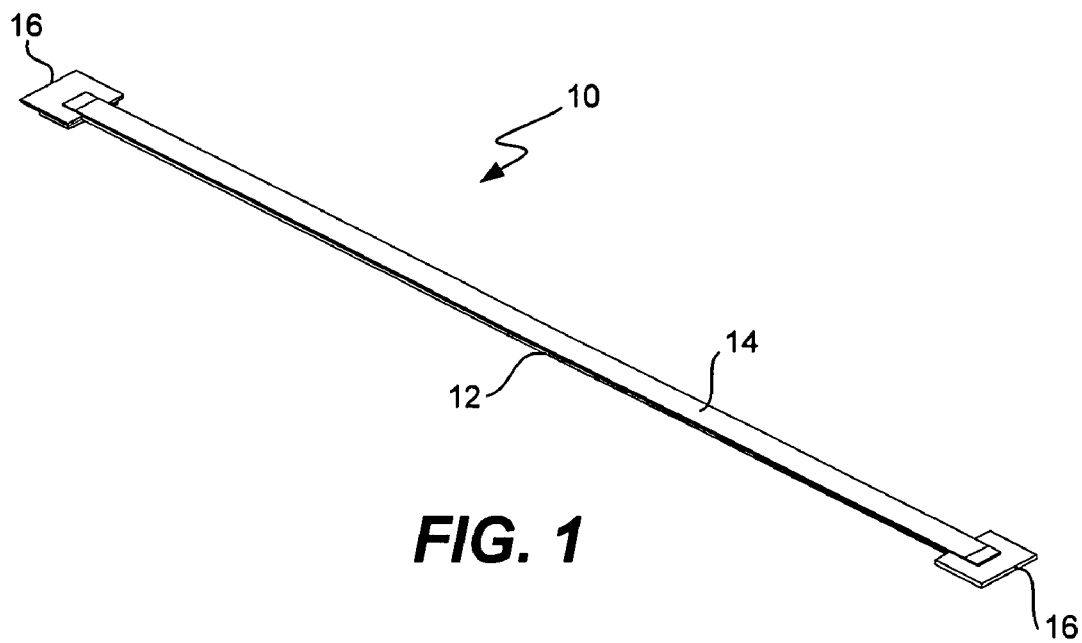
FIG. 1 is a perspective view of a flex interconnect assembly of the present invention.

Referring to FIG. 1, a perspective view of an opto-electric flex interconnect assembly according to the present invention is shown. The opto-electric flex interconnect assembly 10 includes a flexible printed circuit substrate 12 with one or more electrical interconnects 13 (not visible) for transmitting electrical signals and a flexible optical waveguide 14 mounted onto the substrate 12. The optical waveguide 14 includes one or more cores 15 (also not visible) for transmitting optical signals. In one embodiment, the electrical interconnects are used for transmitting power and control signals, whereas the optical cores are used for transmitting data signals.

The assembly 10 further includes electrical-to-optical and optical-to-electrical interfaces 16 located at either end of the assembly 10. As described in more detail below, the waveguide 14 and interfaces 16 provide an optical transport layer integrated within the assembly 10. With interfaces 16, expensive and bulky optical connectors are not needed. The interfaces 16 allow the assembly 10 to be directly connected to other electrical components (not illustrated), such as printed circuits boards, using inexpensive off the shelf electrical connectors.

Figure 2:
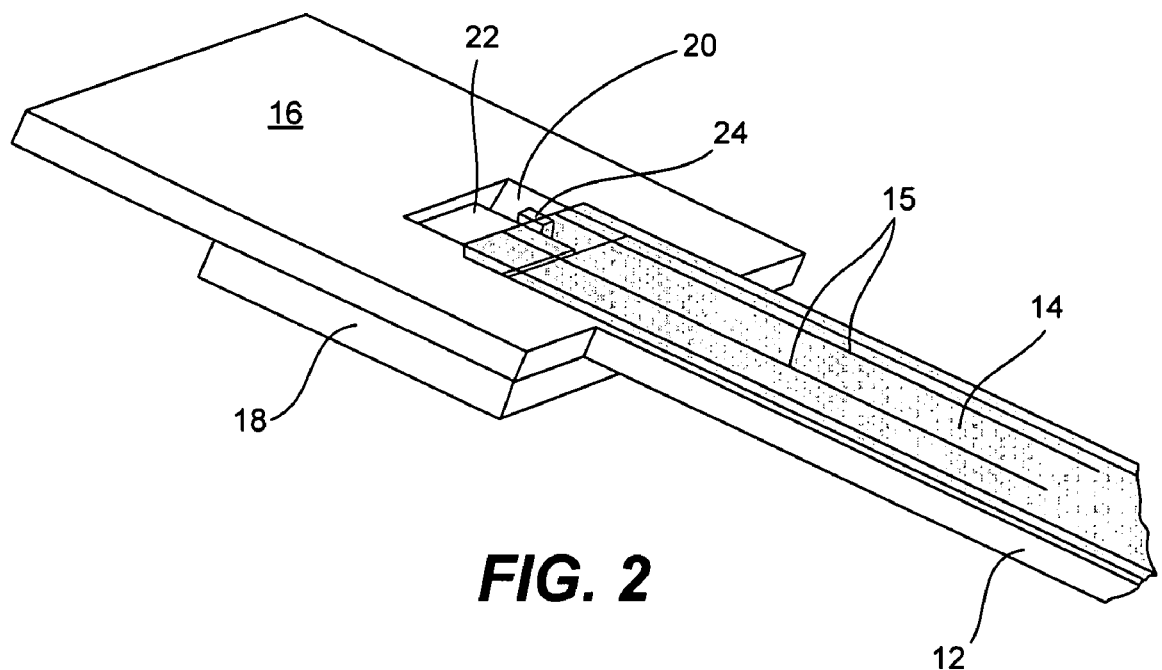
FIG. 2 is an enlarged view of an interconnect module including an integrated transport layer of the flex assembly of the present invention.

FIG. 2 is an enlarged perspective view of one of the interfaces 16 mounted onto a header substrate 18. As illustrated in the figure, the interface 16, in the embodiment shown, includes a rectangular shaped extension of the substrate 12. A recess or window 20 is formed in the extension to accommodate one or more opto-electrical components 22 and 24, which are mounted onto the header substrate 18. With this arrangement, the opto-electrical components 22 and 24 are accessible through the recess 20. The cores 15 of the optical waveguide 14 terminate at the vicinity of the opto-electrical components 22, 24. In this manner, the cores 15 are in optical communication with the components 22, 24, as described in more detail below.

Figure 3A:
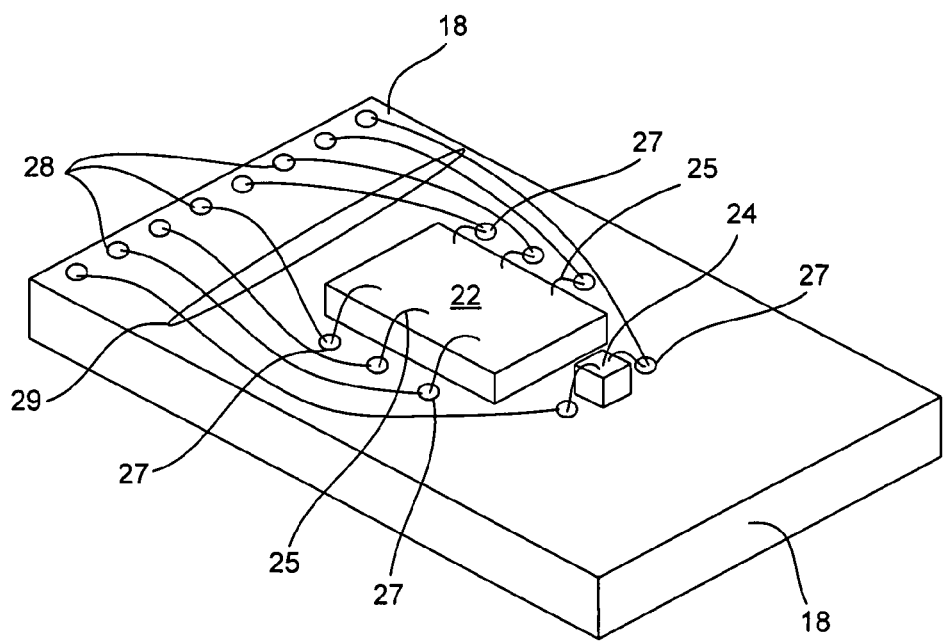
FIG. 3A is a perspective view of a header substrate which mates with the interconnect module of the present invention.

FIG. 3A is a perspective view of the header substrate 18, which is in one embodiment, a printed circuit board. Opto-electric components 22 and 24 are mounted onto the substrate 18. In various embodiments, the components 22 and 24 are semiconductor optical detectors, optical transmitters, or a combination of thereof. For example, the components 22, 24 may be either electrical-to-optical conversion devices such as a laser, LED, or VCSEL. Alternatively, the components 22, 24 may be optical-to-electrical conversion devices, such as a semiconductor photo-detector. In yet another embodiment, one or more of each type of component may be mounted onto the substrate 18. Electrical connections 25, such as wire bonds, are formed between the components 22 and 24 and contacts 27 formed on the substrate 18. Input/output contacts 28 are in electrical connection with the contacts 27 via traces 29 formed on the substrate 18. It should be noted that although the electrical connections are illustrated as wire bonds, this in no way should be construed as limiting the present invention. It is contemplated that other electrical connection types may be used, such as surface mount devices, ball grid array type packages, etc.

Figure 3B:
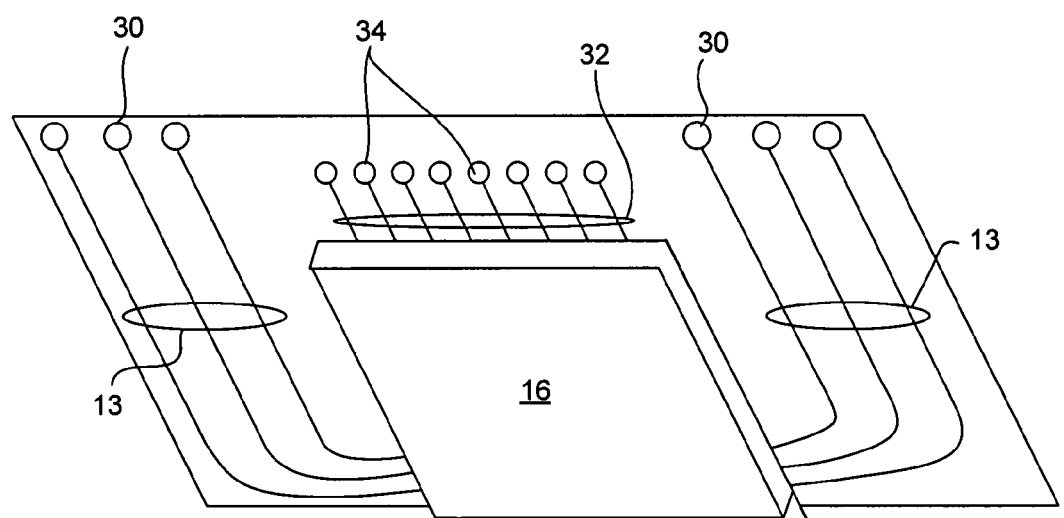
FIG. 3B is a bottom-up view of the header substrate and the interconnect module of the present invention.

Referring to FIG. 3B, a bottom-up perspective view of the module 16 is shown. As illustrated, the header substrate 18 is mounted onto the undersurface of the module 16. As illustrated, the bottom of the module 16 includes the electrical traces 13 of the flexible printed circuit substrate 12, which terminate at contacts 30. Also visible on the undersurface of the module 16 are a second set of traces 32 and contacts 34. These traces 32 are aligned and in electrical contact with the input/output contacts 28 provided on the top surface of substrate 18, as best illustrated in FIG. 3A. With this arrangement, the transport layer is integrated within the assembly 10, without the need for expensive and bulky optical connectors.

Figure 4:
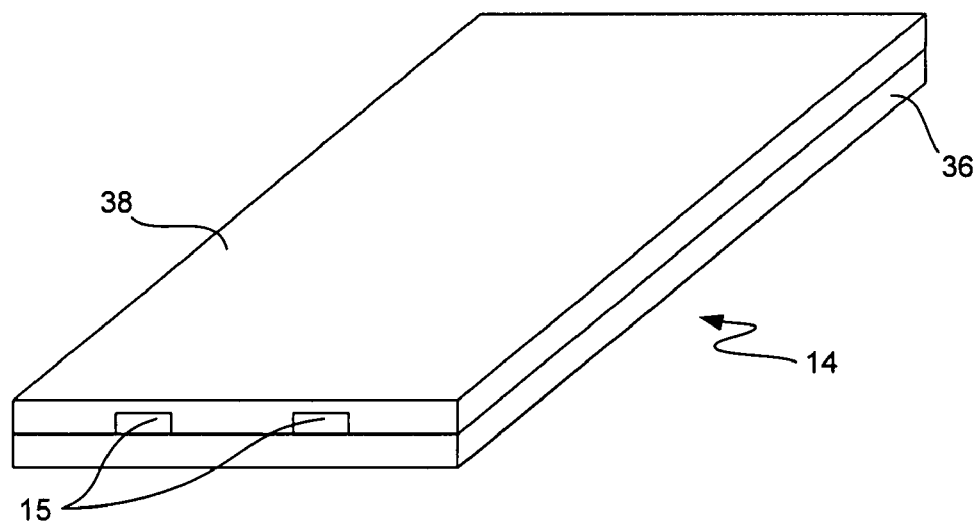
FIG. 4 is a perspective view of an optical waveguide used to make the flex interconnect.
Figure 5:
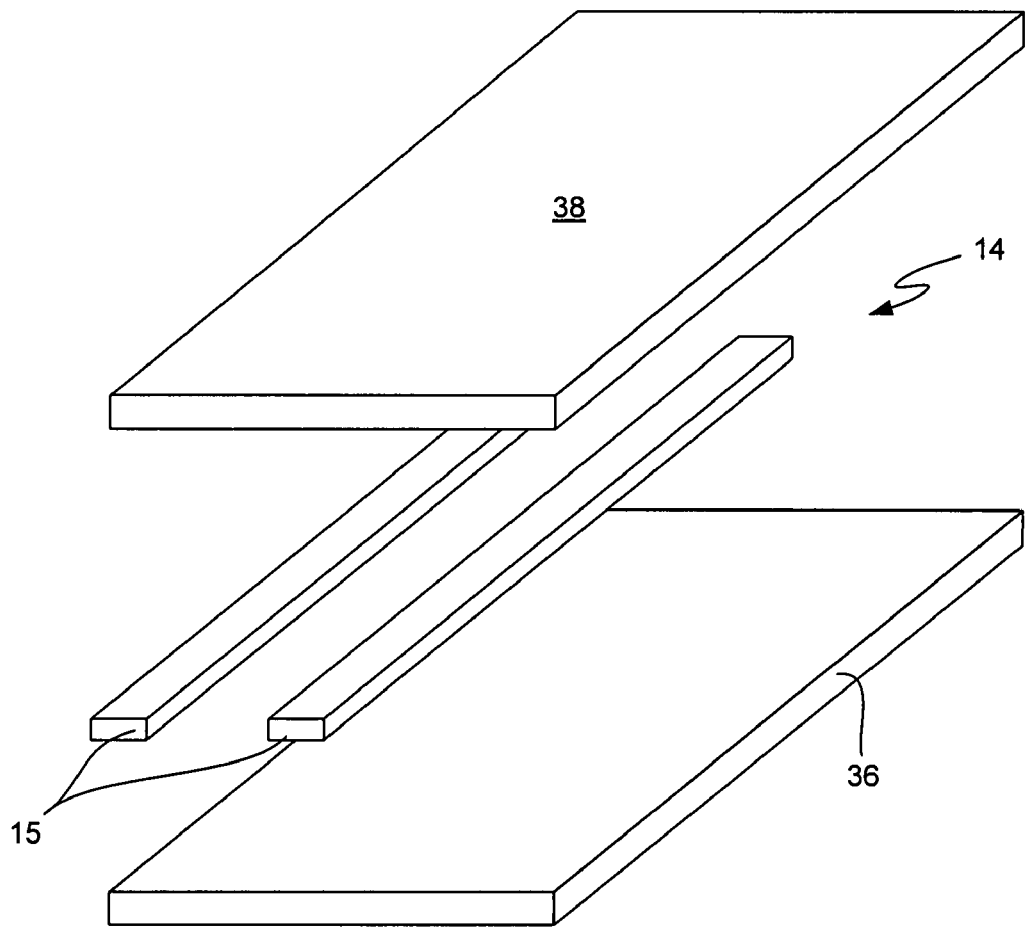
FIG. 5 is an exploded view of the optical waveguide of the flex interconnects.

In one embodiment, the optical waveguide 14 is a polymer waveguide. FIG. 4 is a perspective cross section view of the optical waveguide 14. The optical waveguide 14 includes a first or bottom polymer layer 36, one or more core polymer layers 15 formed on the first polymer layer 36, and a second or top polymer cladding layer 38 formed over the core layers 32. The cores 15 have an index of refraction that is larger than that of both the layers 36 and 38. FIG. 5 shows an exploded view of the bottom layer 36, the two cores 15 and the top cladding layer 38. For the sake of simplicity, only two cores 15 are illustrated. It should be noted that either more or fewer cores may be used in accordance with the present invention. In yet another embodiment, a polymer waveguide need not be used. A waveguide 14 including flexible glass or other optically transparent materials may be used.

In various embodiments, the polymer cores and layers are made from Optically Clear Photopolymers, including, but not limited to Polysiloxanes, Polymethylmethacrylates, epoxies, and other materials or a combination thereof. For more details on polymer waveguides, see US Patent Publication No. 2005/0201681 entitled "HYBRID WAVEGUIDE," U.S. Pat. No. 7,267,930 entitled "TECHNIQUES FOR MANUFACTURING A WAVEGUIDE WITH A THREE-DIMENSIONAL LENS," US Patent Publication No. 2005/0271326 entitled "WAVEGUIDE WITH A THREE-DIMENSIONAL LENS," US Patent Publication No. 2006/0002655 entitled "APPARATUS AND METHOD FOR MAKING FLEXIBLE WAVEGUIDE SUBSTRATES FOR USE WITH LIGHT BASED TOUCH SCREENS," US Patent Publication No. 2006/0001653 entitled "APPARATUS AND METHOD FOR A FOLDED OPTICAL ELEMENT WAVEGUIDE FOR USE WITH LIGHT BASED TOUCH SCREENS," US Patent Publication No. 2005/0271319 entitled "APPARATUS AND METHOD FOR A MOLDED WAVEGUIDE FOR USE WITH TOUCH SCREEN DISPLAYS, and U.S. application Ser. No. 11/498,356, entitled "APPARATUS AND METHOD FOR A SINGULATION OF POLYMER WAVEGUIDES USING PHOTOLITHOGRAPHY," all assigned to the assignee of the present invention, and incorporated by reference herein for all purposes.

Figure 6:
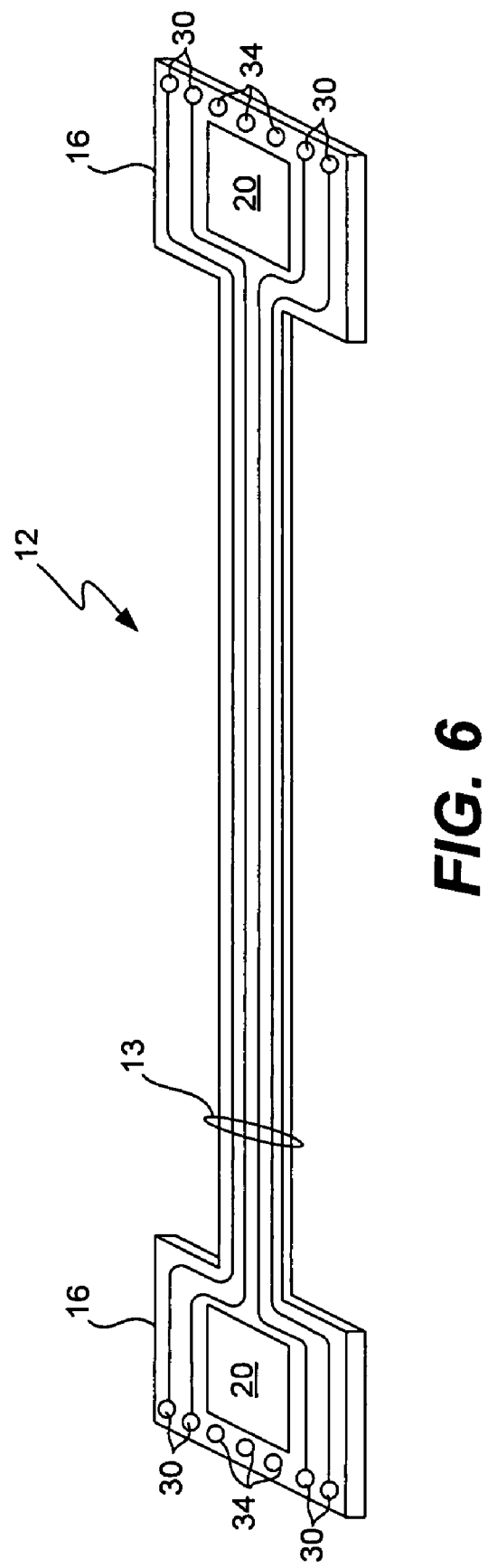
FIG. 6 is a perspective view of a flex printed circuit substrate of the flex assembly of the present invention.

FIG. 6 is a perspective view of a flex printed circuit substrate 12. The substrate 12 includes, as noted above, the interfaces 16 located at each end of the substrate 12. The recess regions 20 are formed in the interface 16 to accommodate the devices 22, 24 when mounted on the header substrate 18, as described above. Electrical interconnects 13 are formed along the length of the substrate 12 and terminate at contacts 30 on either end of the substrate 12. Also visible are the contacts 34, which again, are intended to be aligned and in contact with the input/output contacts 28 on the header substrate 18.

Figure 7:
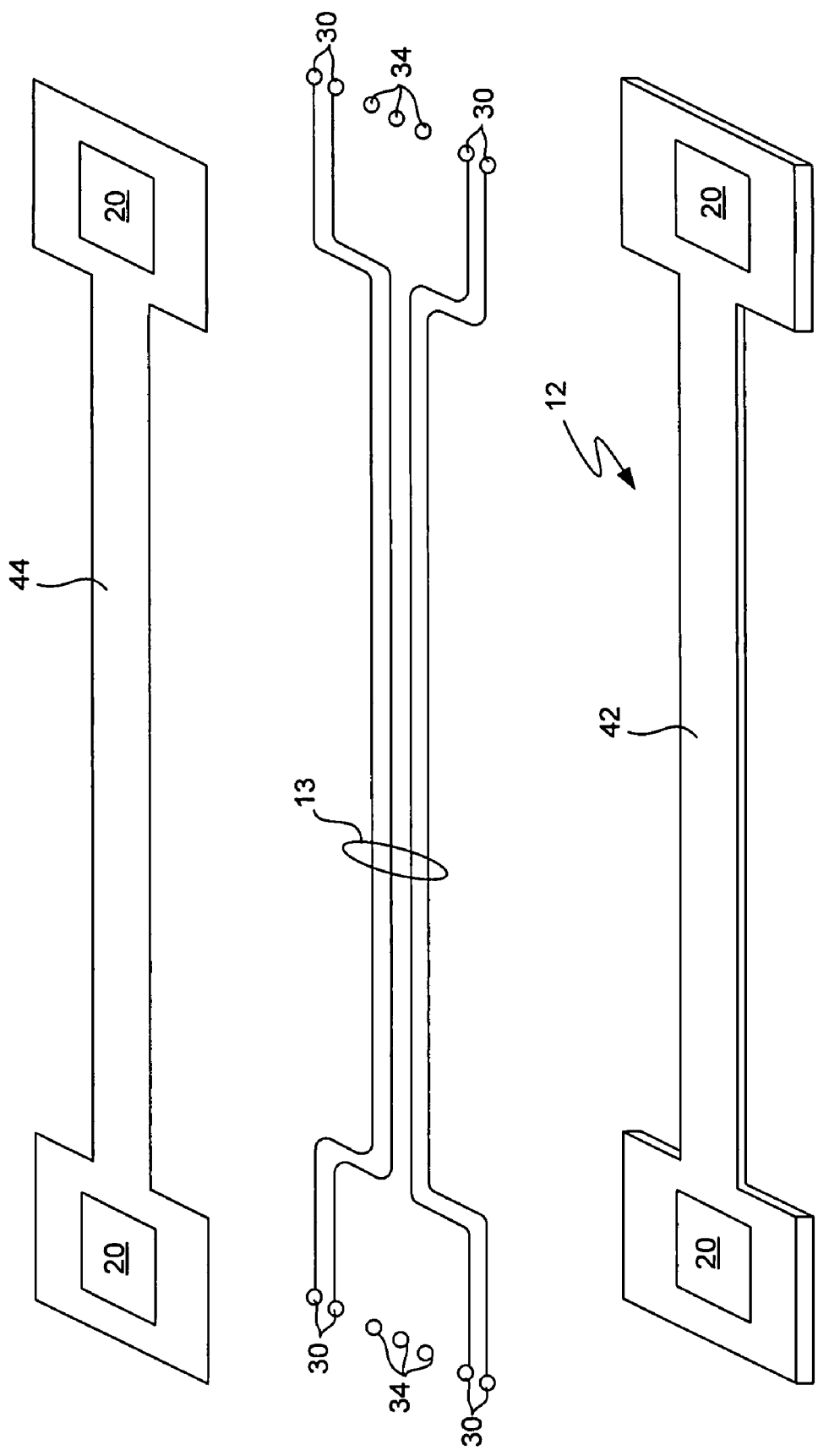
FIG. 7 is an exploded view of the flex printed circuit substrate used by flex assembly of the present invention.

FIG. 7 is an exploded view of the flex printed circuit substrate 12. As illustrated in the figure, the substrate 12 includes a bottom flexible substrate 42 made from a non-conductive material, such as polyimide, the electrical interconnects 13 and contacts 30, and 34 formed by a metallization pattern on the bottom substrate 42, and a top insulating surface 44 made from, for example, a non-conductive polymer. The layer 44 is patterned so that contacts 30 and 34 are exposed.

In various embodiments, a glue or epoxy may be used to secure the waveguide 14 to the flex substrate 12. Similarly, a glue or epoxy may be used to mount the header substrates 18 to modules 16. In various embodiments, alignment pins or other alignment mechanisms may be used between the flex substrate 12 and the header substrate 18 so that the aforementioned electrical contacts are in alignment with one another respectively.

Figure 8:
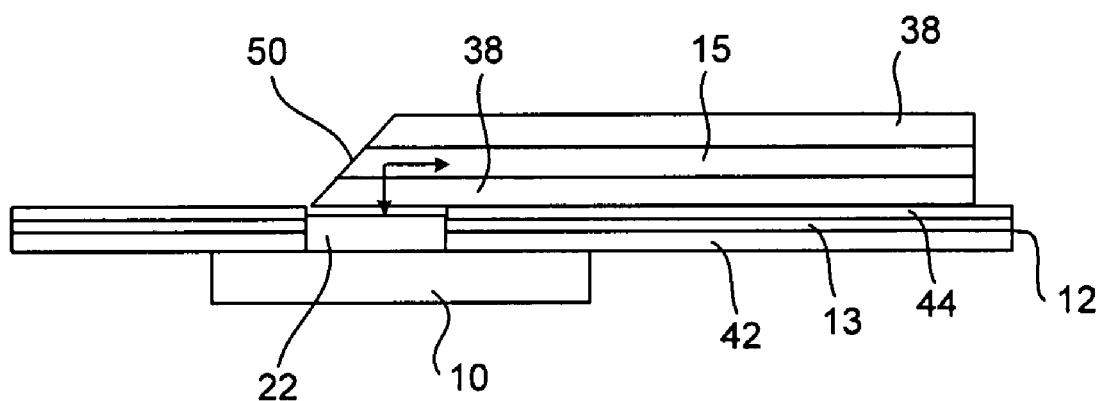
FIG. 8 is a cross section illustrating the optical connection between a core of the optical waveguide and an optical component according to the present invention.

FIG. 8 is a diagram illustrating the optical connection between a core 15 of the waveguide 14 and an optical component 22, for example, according to the present invention. In the embodiment shown, the ends of the core 15 is terminated at a predetermined angle and coated with a reflective or mirrored surface 50. With this arrangement, light traveling down the core 15 reflects off the surface 50 and toward device 22, assuming the device 22 is a photo-detector. Alternatively, if the opto-electric device 22 is a transmitter, light transmitted from the device 22 reflects off the mirrored surface 50 and down the length of the core 15. A similar arrangement would be used with device 24. As noted above in relation to FIG. 3A, the arrangement of the devices 22, 24 mounted onto the header substrate 18 and in optical alignment with cores 15 provide an transport layer integrated within the assembly 10. In yet another embodiment, the devices 22, 24 can be rotated ninety degrees so that either their photosensitive circuitry or the transmitter provided on these devices are in optical alignment with the ends of the cores 15. With such an arrangement, the use of an angled reflective or mirrored surface 50 would not be needed.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

I claim:

1. A flexible interconnect assembly, comprising:
   a flexible printed circuit substrate:
   one or more electrical interconnects formed on the flexible printed circuit substrate, for transmitting one or more electrical signals respectively; and
   an optical waveguide mounted onto the flexible printed circuit substrate, the waveguide having one or more cores for transmitting one or more optical signals; and
   first and second interfaces situated at first and second ends of the flex interconnect assembly respectively, each interface comprising:
      an interface substrate;
      a header substrate mounted on the interface substrate;
      one or more conversion devices embedded within the interface and positioned on the header substrate, the one or more conversion devices in optical alignment with the optical waveguide and configured to convert between electrical and optical signals and arranged such that all conversion between optical and electrical signals performed at the flexible interconnect assembly takes place only in the interfaces at the ends of the flexible interconnect assembly;
      a plurality of electrically conductive traces, ones of the conductive traces electrically connected with associated ones of the one or more conversion devices; and
      a plurality of exposed electrical contacts that are formed on the exterior of the interface, ones of the exposed electrical contacts being electrically connected with ones of the conversion devices via ones of the electrically conductive traces, the plurality of exposed contacts arranged to be coupled with an electrical device external to the flexible interconnect assembly.

2. The flexible interconnect assembly of claim 1, wherein each interface further comprises electrical contacts formed on the header substrate and in electrical communication with the one or more conversion devices.

3. The flexible interconnect assembly of claim 2, wherein each interface further comprises second contacts, the second contacts in electrical communication with the one or more electrical interconnects formed on the flexible printed circuit substrate and the electrical contacts formed on the header substrate and in electrical communication with the one or more conversion devices.

4. The flexible interconnect assembly of claim 1, wherein the one or more conversion devices comprise either:
   (i) one or more electrical-to-optical devices consisting of: a laser, LED, or VCSEL;
   (ii) one or more optical-to-electrical devices consisting of: semiconductor optical detector; or
   (iii) both (i) and (ii).

5. The flexible interconnect assembly of claim 1, wherein the flexible printed circuit substrate comprises:
   a flexible non-conductive substrate;
   the one or more electrical interconnects formed on the flexible non-conductive substrate;
   an insulating layer formed over the one or more electrical interconnects formed on the flexible non-conductive substrate; and
   a recess formed in the flexible printed circuit substrate to accommodate the conversion devices in a position adjacent the one or more cores of the optical waveguide.

6. The flexible interconnect assembly of claim 5, wherein the flexible non-conductive substrate is polyimide.

7. The flexible interconnect assembly of claim 1, wherein the optical waveguide is a polymer waveguide which comprises:
   a first polymer layer;
   the one or more cores formed on the first polymer layer; and
   a second polymer layer formed over the one or more cores, wherein the one or more cores have an index of refraction that is larger than the first polymer layer and the second polymer layer.

8. The flexible interconnect assembly of claim 1, wherein the one or more cores are each terminated at a predetermined angle to create an internally reflective surface.

9. The flexible interconnect assembly of claim 1 wherein:
   each of the first and second interfaces includes an electrical connection configured to receive electrical signals from at least one of a plurality of external electrical components external to the flexible interconnect assembly; and
   a first electro-optic conversion device arranged at the first interface, the first electro-optic conversion device configured to perform at least one of an electrical-to-optical conversion and an optical-to-electrical conversion, wherein an electrical-to-optical conversion involves converting electrical signals received from at least one of the external electrical components into optical signals that are transmitted through the waveguide and wherein an optical-to-electrical conversion involves converting optical signals received from the waveguide into electrical signals suitable for transmission through said electrical connection to at least one of the external electrical components.

10. The flexible interconnect assembly of claim 9, wherein the first interface is mounted on a printed circuit board.

11. The flexible interconnect assembly of claim 9, wherein any electrical-to-optical conversion performed by the flexible interconnect assembly involves converting electrical signals that are received from the plurality of external electrical components and wherein the plurality of external electrical components are coupled with the flexible interconnect assembly via the first and second interfaces and are not mounted directly on the flexible printed circuit substrate.

12. The flexible interconnect assembly of claim 9, wherein the cross-sectional width of the optical waveguide is not greater than approximately 10 microns.

13. The flexible interconnect assembly of claim 12, wherein the width of each header substrate is substantially greater than the width of each of the optical waveguide and the flexible printed circuit substrate.

14. The flexible interconnect assembly of claim 13, wherein the optical waveguide is formed from polysiloxane.

15. The flexible interconnect assembly of claim 13, wherein the flexible interconnect assembly does not include any other optical waveguide other than the optical waveguide recited in claim 13; and
   outside of the interfaces situated at the ends of the flexible interconnect assembly, there are no conversion devices suitable for converting between optical and electrical signals on the flexible interconnect assembly.

16. The flexible interconnect assembly of claim 1, wherein:
   the interface substrate includes a top surface and an opposing bottom surface;

the header substrate is mounted directly onto the top surface of the interface substrate;

the one or more conversion devices are situated in a opening in the top surface of the interface substrate; and the plurality of contacts and the plurality of electrically conductive traces are formed on at least one of the top surface and the bottom surface of the interface substrate.

17. A method, comprising:

providing a flexible interconnect assembly, including:

providing a flexible printed circuit substrate, the provided flexible printed circuit substrate including one or more electrical interconnects, formed on the flexible printed circuit substrate, for transmitting one or more electrical signals respectively; and mounting an optical waveguide mounted onto the flexible printed circuit substrate, the waveguide having one or more cores for transmitting one or more optical signals;

providing first and second interfaces situated at first and second ends of the flexible printed circuit substrate respectively, each interface comprising:

an interface substrate;

a header substrate mounted on the interface substrate;

one or more conversion devices embedded within the interface substrate and positioned on the header substrate, the one or more conversion devices in optical alignment with the optical waveguide, and configured to convert between electrical and optical signals and arranged such that all conversion between optical and electrical signals performed at the flex interconnect assembly takes place only in the interfaces at the ends of the flexible interconnect assembly;

a plurality of electrically conductive traces, ones of the conductive traces electrically connected with associated ones of the one or more conversion devices; and a plurality of exposed electrical contacts that are formed on the exterior of the interface, ones of the exposed electrical contacts being electrically connected with ones of the conversion devices via ones of the electrically conductive traces, the plurality of exposed contacts arranged to be coupled with an electrical device external to the flexible interconnect assembly.

18. The method of claim 17, wherein the provided interface further comprises:

providing electrical contacts formed on the header substrate and in electrical communication with the one or more conversion devices.

19. The method of claim 18, wherein the provided interface further provides second contacts, the second contacts in electrical communication with the one or more electrical interconnects formed on the flexible printed circuit substrate and the electrical contacts formed on the header substrate and in electrical communication with the one or more conversion devices.

20. The method of claim 17, wherein the one or more provided conversion devices comprise:

(i) one or more electrical-to-optical devices consisting of: a laser, LED, or VCSEL;

(ii) one or more optical-to-electrical devices consisting of: semiconductor optical detector; or (iii) both (i) and (ii).

21. The method of claim 17, wherein the provided flexible printed circuit substrate comprises:

a flexible non-conductive substrate;

the one or more electrical interconnects formed on the flexible non-conductive substrate;

an insulating layer formed over the one or more electrical interconnects formed on the flexible non-conductive substrate; and a recess formed in the flexible printed circuit substrate to accommodate the conversion devices in a position adjacent the one or more cores of the optical waveguide.

22. The method of claim 21, wherein the provided flexible non-conductive substrate is polyimide.

23. The method of claim 17, wherein the provided optical waveguide is a polymer waveguide, which comprises:

a first polymer layer;

the one or more cores formed on the first polymer layer; and a second polymer layer formed over the one or more cores, wherein the one or more cores have an index of refraction that is larger than the first polymer layer and the second polymer layer.

24. The method of claim 17, wherein the provided one or more cores are each terminated at a predetermined angle to create an internally reflective surface.

* * * * *